United States Patent [19]
Chiu

[11] Patent Number: 5,136,367
[45] Date of Patent: Aug. 4, 1992

[54] LOW COST ERASABLE PROGRAMMABLE READ ONLY MEMORY PACKAGE

[75] Inventor: Anthony M. Chiu, Richardson, Tex.

[73] Assignee: Texas Instruments Incorporated, Dallas, Tex.

[21] Appl. No.: 576,310

[22] Filed: Aug. 31, 1990

[51] Int. Cl.⁵ .................. H01L 23/12; H01L 23/32
[52] U.S. Cl. .................................... 357/74; 357/70
[58] Field of Search .................. 357/70, 72, 74, 84

[56] References Cited

U.S. PATENT DOCUMENTS

| | | | |
|---|---|---|---|
| 4,742,023 | 5/1988 | Hasegawa | 357/67 |
| 4,801,998 | 1/1989 | Okuaki | 357/72 |
| 4,843,225 | 6/1989 | Hoppe | 357/84 |
| 4,870,476 | 9/1989 | Solstad | 357/70 |
| 4,878,990 | 11/1989 | Dugan et al. | 357/70 |
| 4,899,207 | 2/1990 | Hallowell et al. | 357/70 |
| 4,948,645 | 8/1990 | Holzinger et al. | 357/70 |
| 4,967,260 | 10/1990 | Butt | 357/70 |

Primary Examiner—Andrew J. James
Assistant Examiner—S. V. Clark
Attorney, Agent, or Firm—B. Peter Barndt; Richard L. Donaldson

[57] ABSTRACT

A semiconductor device and package includes a tape mounted semiconductor chip using bumped contacts, the top side of the chip is covered with a thin layer of ultra violet transmissive material, and a plastic removable frame surrounds the device and is removed after testing the device and prior to mounting the device on a printed circuit board.

24 Claims, 4 Drawing Sheets

LOW COST ERASABLE PROGRAMMABLE READ ONLY MEMORY PACKAGE

FIELD OF THE INVENTION

This invention relates to semiconductor packages, and more particularly to low cost Erasable-Programmable-Read-Only-Memory (EPROM) package having a ultra violet transparent gel coating on the top of the semiconductor memory chip device.

BACKGROUND OF THE INVENTION

The demand for ever higher circuit board density has resulted in small size semiconductor devices having a low profile. Board space considerations have traditionally been viewed from a two dimensional perspective, and the motivation for thin packaging has been a secondary issue. However, with the electronic industry is looking at thin packaging to address density issues associated with products like memory cards, smart cards, and emulator cards, package thickness is now a critical factor.

EPROM packaging is more expensive than conventional molded plastic packages due to the need of a glass window to expose the memory chip to ultra violet light to erase the data stored in the memory cells. The standard package for such devices is an expensive ceramic cavity package with a light transmissive glass lid over the top of the package and above the memory device.

Prior art packages which include conventional packaging such as National Semiconductors TapePak ™, Tape Automated Bonding (TAB), Dual In-line Plastic (DIP) packages, and Small Outline Packages (SOPs) are not used since these plastic encapsulated packages do not provide the ultra violet transmissive windows. Conventional prior art packages use wire bonds to interconnect the chip to a leadframe which is an integral part of a ceramic cavity package. A quartz lid is applied over the opening to the cavity after wire bonding. The chip is sealed inside the cavity to make a hermetic package. The cost of this packaging technique is very expensive in both material and assembly labor. Prior art semiconductor devices are packaged prior to testing and burning such that if the device tests to be a faulty device, then the costs of manufacturing the entire device is lost. TAB packaging uses a liquid plastic to encapsulate the semiconductor chip resulting in much simplified process steps and material cost savings.

SUMMARY OF THE INVENTION

This invention is a low cost package for EPROM devices using chip-on-tape technology. Other assembly methods, such as wire bonding, can also be used. Semiconductor chips are bonded on a continuous strip of lead frames. A multi-point (gang) thermal compression Inner Lead Bond (ILB) is used. This lead bond is also used in co-pending patent applications: Ser. No. 07/576,312, filed Aug. 31, 1990, and entitled HIGH INTEGRITY THIN MOLDED SEMICONDUCTOR PACKAGE AND METHOD OF MAKING; and Ser. No. 07/576,311, filed Aug. 31, 1990, and entitled HIGH INTEGRITY ULTRA-THIN SEMICONDUCTOR PACKAGE AND METHOD OF MAKING. The semiconductor devices may be pre-tested and burned-in on the tape providing reel-to-reel processing using a multi-layer tape. The interconnection side of the chip is the side of the memory which, when exposed to ultra violet light, will erase data stored in the memory cells. A ultra violet transmissive gel, for example a gel (EPR-250-1) manufactured by Dexter Electronic Materials Division, Industry, Calif., may be used to eliminate the ceramic/glass package, and the gel may also be used as a top encapsulant for the semiconductor device using the TAB process. A similar gel is also made by Dow Corning Corporation, Part No. HIPEC Q1-4939. Another material, by G. E. Silicones, is also compatible with this type of application. The gel may also be applied to top coat a device that is wire bonded. The gel also provides mechanical protection to the device.

Both the package thickness and weight are reduce by the use of a thin coating on the surface of the chip, and by the use of a TAB interconnection, eliminating the wire loop present with wire bonding.

The leadframe tape is simplified by the elimination of multiple dam bars for molding. Processing of the device is simplified at several stages of manufacture: by the elimination of bevel-cut during wafer saw; by multi-point ("gang") bonding; and the devices can be processed in either "strip", "reel-toreel" or "singulated" format.

There is an improvement in reliability of performance and manufacturing yield: due to the higher bond reliability from improvement in bond strength, due to the fact that the molded frame supplies package durability necessary during removal of the device from the molded frame, due to the fact that the frame is molded after ILB to add a higher degree of package durability; due to improved heat transfer because of the elimination of one level of interconnect (wire bonding); and due to the improved high frequency performance because of the rectangular shape of the TAB lead.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
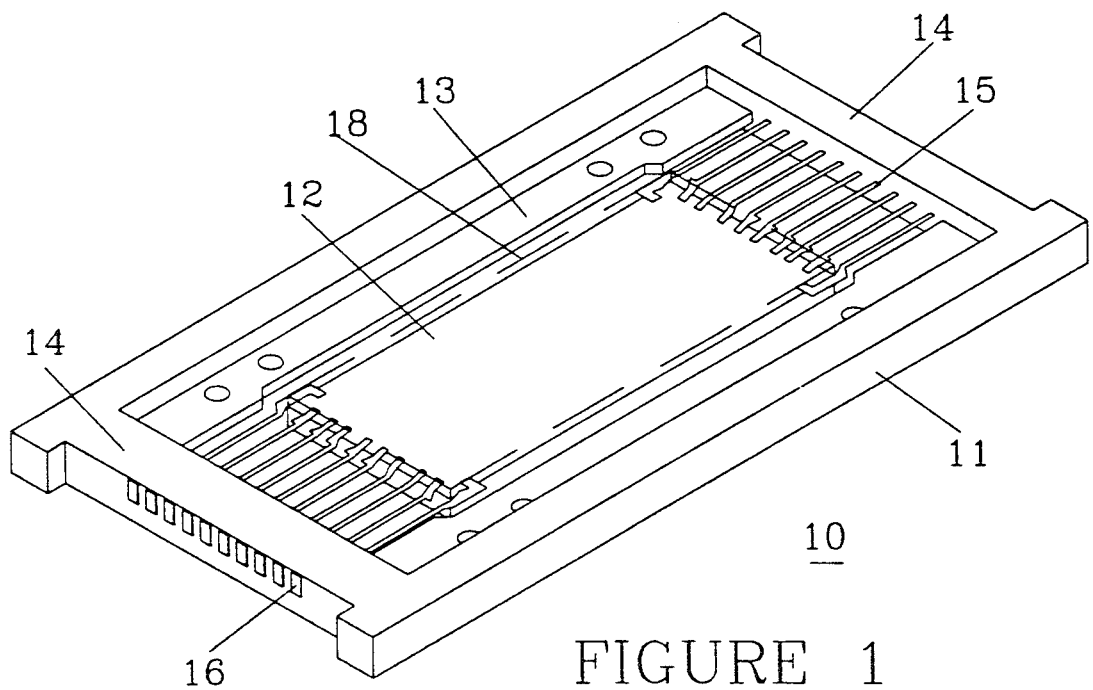
FIG. 1 illustrates an embodiment of the invention.

Devices have been fabricated using the following method for "strip" processing. FIG. 1 illustrates a semiconductor device assembly 10 mounted in a plastic frame with dam bars removed so that the device may be tested and burned-in prior to removal from the plastic frame. Semiconductor chip 12 has leads 15 extending from two ends. Leads 15 extend through plastic frame 11 at and are bent, at 16, against the ends 14 of frame 11. The top surface of chip 12 is coated with an ultra violet transmissive material 18 which coats the top side of semiconductor chip 12.

The basic process of manufacturing device 10 is as follows. A semiconductor chip 12 is sawed from a wafer having a plurality of integrated circuit devices. The semiconductor chip 12 is placed adjacent to leads 15 and the chip is Inner Lead Bonded to leads 15. At this point the devices may be stored as "chip-ontape" on a reel, or the devices may be separated into strips of devices, for example, strips of ten devices. The devices are then placed in a mold cavity to produce molded frame 11. The topside of the device (chip 12 and part of leads 15) is then encapsulated with the ultra violet transmissive material 18. The gel and the molded frame are heat cured to a stable form.

Dam bars 26,28 (see FIG. 3) are then removed and the strip of ten devices are separated into single units as illustrated in FIG. 1. Each device is then pretested and burned-in.

Figure 2:
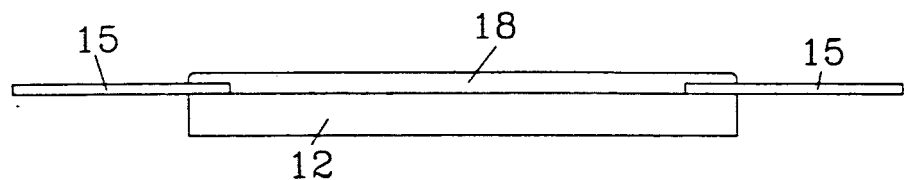
FIG. 2 is a side view of a device removed from the molded frame.

FIG. 2 illustrates a side view of the semiconductor device 10 showing the chip 12, leads 15 and the top side encapsulant 18. Leads may be bent at a 90° angle to insert the leads 15 into a printed circuit board, or into the solder paste on the board, or the leads 15 may be "gull-wing" shaped to surface mount the device.

Figure 3:
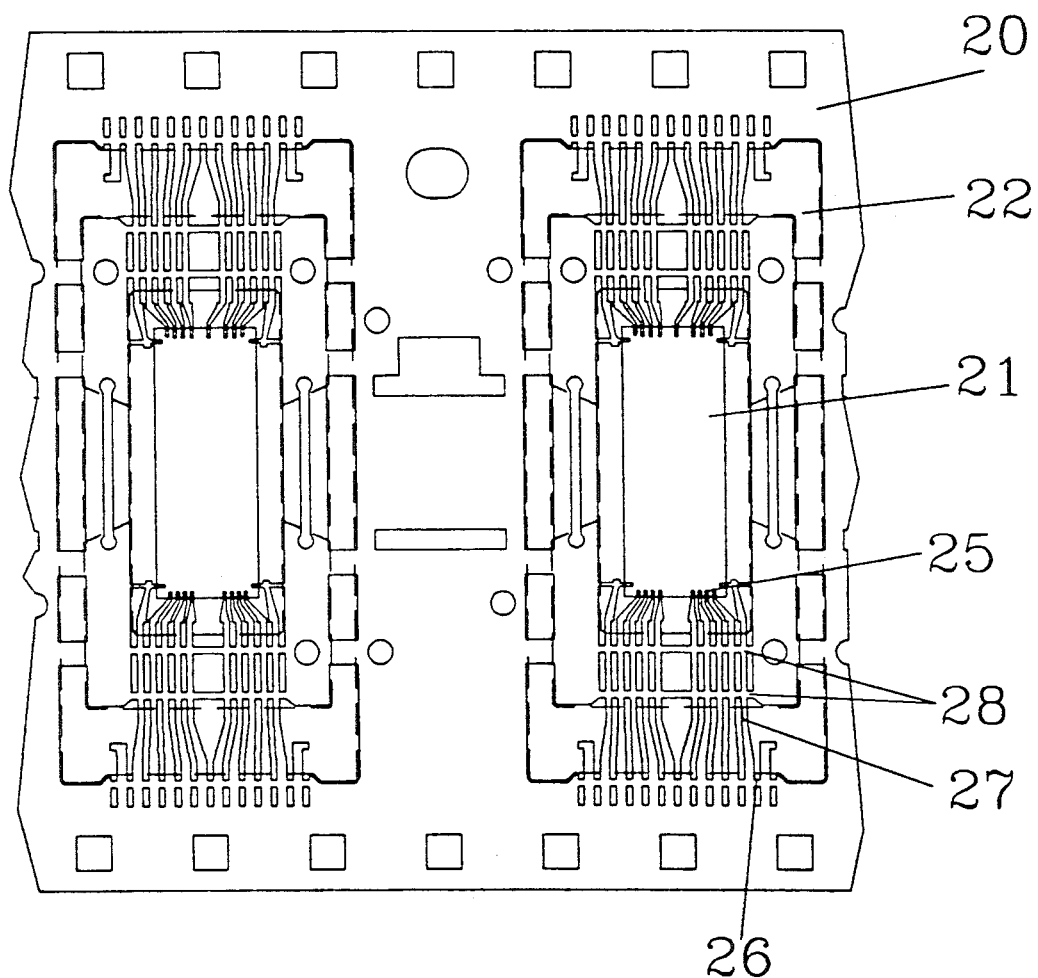
FIG. 3 illustrates an example of the invention showing two devices mounted on TAB tape.

FIG. 3 illustrates two devices mounted on a lead frame tape 20. Semiconductor chip 21 is secured to leads 27 at reduced ends 25. The lead ends 25 are reduced to permit the connection of all the needed leads for the device. Lead ends 25 may be angled from the straight portions of leads 27 to permit the lead ends to be located at the desired contact areas of chip 21. Dam bars 28 tie leads 27 together to add support during mounting of chip 21 to leads 27 and during molding of frame 22. Each device has the ultra violet transmissive coating over the top of the chip 21 and a portions of the lead ends 25. This gel can also be applied before or after molding.

The ends of leads 27 are removed (at 26) a short distance from frame 22 and are bent-up against the frame 22, as illustrated in FIG. 1.

Figure 4:
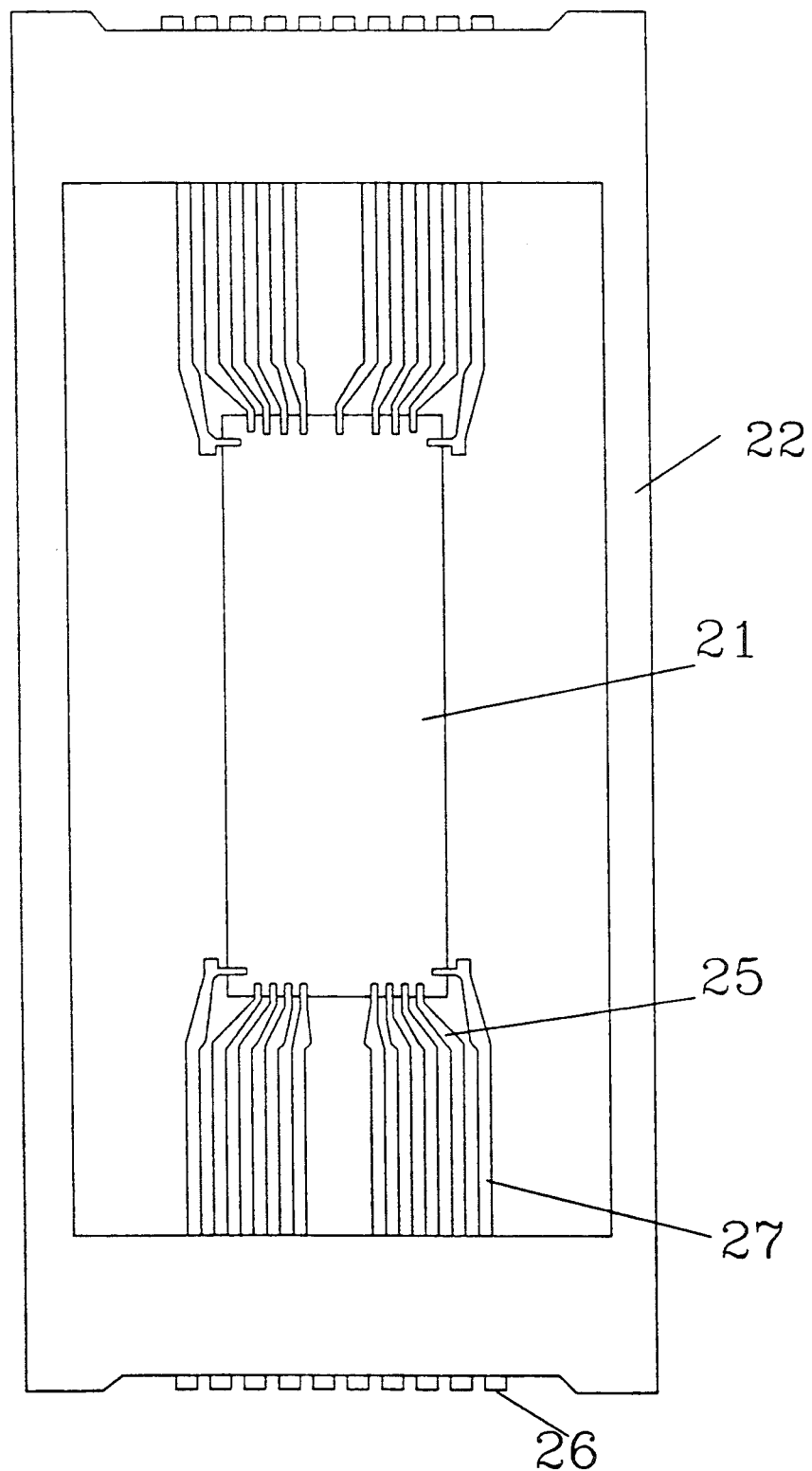
FIG. 4 illustrates a top view of a device after removal from the leadframe tape.

FIG. 4 illustrates a single device after it has been removed from the lead frame strip and the dam bars removed. Semiconductor chip 21 is secured to leads 27 by the lead ends 25. Leads ends 25 are bonded to contact pads on the semiconductor chip by, for example, gang bonding. Plastic frame 22 surrounds the semiconductor with leads 27 extending through two opposite ends of the plastic frame 22. Lead ends 26 are bend against the plastic frame to form contacts by which the semiconductor device may be tested prior to removing from plastic frame 22.

Figure 5:
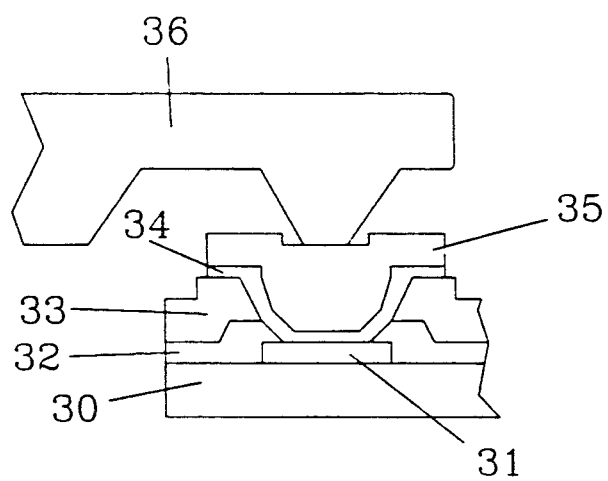
FIGS. 5, 6 AND 7 illustrate several contact configurations.
Figure 6:
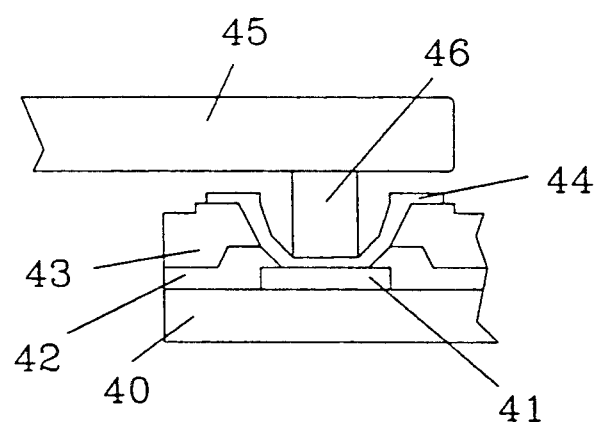
Figure 7:
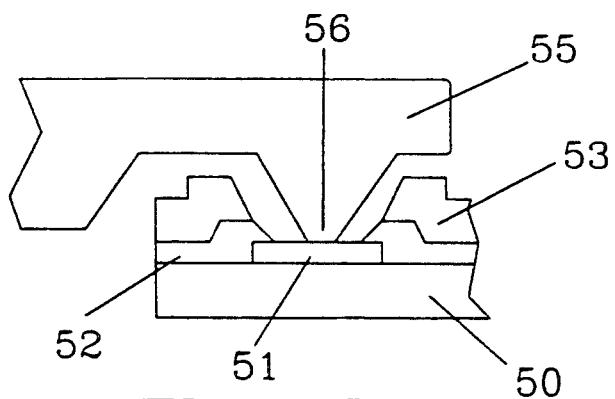

The bumped chip is illustrated in FIGS. 5, 6 and 7. FIG. 5 depicts a contact with a thick cap bond. A silicon chip 30 has an aluminum contact 31 on a contact area of the chip. A protective oxide 32 is placed over the surface of the silicon chip 30 and part of the aluminum contact 31. A layer of insulating material 33, for example polyimide, is placed over the protective oxide 32. A barrier metal 34, for example TiW, is placed over the aluminum contact, and in the opening in the protective oxide 32. A bump contact 35, which maybe be of gold, copper, or copper/solder, is formed over barrier metal 34. The bumped lead 36 from the leadframe is then bonded the bump contact 35.

FIG. 6 illustrates another embodiment of the bump contact. Silicon chip 40 has an aluminum contact 41 on a contact area of the chip. A protective oxide 42 is placed over the surface of the silicon chip and part of the aluminum contact 41. A layer of insulating material 43, for example polyimide, is placed over the protective oxide. A barrier metal 44, for example TiW, is placed over the aluminum contact 41 and in the opening in the protective oxide 42. A bump contact 46, which maybe be of gold, copper, or copper/solder, is formed over the barrier metal. The flat lead 45 from the lead frame is then contacted to the bump contact 46.

FIG. 7 illustrates bonding to the bare aluminum with and without thin protective metals such as gold or palladium. Silicon chip 50 has an aluminum contact 51 on a contact area of the chip. A protective oxide 52 is placed over the surface of the silicon chip and part of the aluminum contact 51. A layer of insulating material 53, for example polyimide, is placed over the protective oxide. Lead 55, from the lead frame, is then contacted to the contact 51 with bump contact 56. In this illustration the barrier metal and gold or copper protective metal is not used. Also, contact may be made to the aluminum contact using a protective metal such as gold plated on the copper lead.

What is claimed:

1. A low cost package for Erasable-Programmable-Read-Only-Memory devices, including a tape leadframe having leads integrally connected to the top side of the semiconductor chip, comprising:
   a semiconductor chip attached to a tape leadframe,
   bumped contacts on the top side of the semiconductor device in electrical connection with the bumped leads on the lead frame;
   an ultra violet transmissive encapsulant material encapsulating the top side of the EPROM semiconductor device; and
   a removable molded frame attached to the leads and a portion of the leadframe, surrounding and spaced from the encapsulated semiconductor chip with a portion of the leads extending through the molded frame.

2. The packaged semiconductor device according to claim 1, wherein the leads connected to the top side of the semiconductor chips are fanned out of the ultra violet transmissive coated semiconductor device and extend through the molded frame in two or more sides.

3. The packaged semiconductor device according to claim 2, wherein the leads extending through the molded frame are folded against the molded frame to provide test contacts to the semiconductor device.

4. The packaged semiconductor device according to claim 2, wherein the leads extending through the molded frame are straight to provide contacts from above and below the device.

5. The packaged semiconductor device according to claim 1, wherein the bumped contacts includes a barrier metal on aluminum, with a compliant bump of gold.

6. The packaged semiconductor device according to claim 1, wherein the bumped contacts includes barrier metal of TiW on aluminum, with a compliant bump of copper coated with protective metal.

7. The packaged semiconductor device according to claim 1, wherein the tape-leadframe leads have bumped contacts thereon.

8. The packaged semiconductor device according to claim 7, wherein the lead frame is a bumped copper tape plated with gold.

9. The packaged semiconductor device according to claim 7, wherein the lead frame is a bumped copper tape plated with palladium.

10. The packaged semiconductor device according to claim 7, wherein the leadframe is a bumped bare copper tape.

11. The packaged semiconductor device according to claim 1, wherein there are dam bars between leads, and including multiple sets of registration holes to align the device during the removal of the dam bars and the removal of the frame.

12. A low cost package for Erasable-Programmable-Read-Only-Memory devices, including a tape leadframe having leads integrally connected to the top side of the semiconductor chip, comprising:

a semiconductor chip attached to a tape leadframe, non-bumped contacts on the top side of the semiconductor device in electrical connection with the bumped leads on the lead frame;

an ultra violet transmissive encapsulant material encapsulating the top side of the semiconductor chip;

a removable molded frame attached to the leads and a portion of the leadframe, surrounding and spaced from the semiconductor chip, a portion of the leads extending through the molded frame.

13. The packaged semiconductor device according to claim 12, wherein the leads connected to the top side of the semiconductor chip are fanned out of the ultra violet transmissive coated semiconductor device and extend through the molded frame in two or more sides.

14. The packaged semiconductor device according to claim 13, wherein the leads wires extending through the molded frame are folded against the molded frame to provide test contacts to the semiconductor device.

15. The packaged semiconductor device according to claim 14, wherein the leads extending through the molded frame are straight to provide contacts from above and below the device.

16. The packaged semiconductor device according to claim 12, wherein the bonding is made to bare aluminum bond pads.

17. The packaged semiconductor device according to claim 12, wherein bonding is made to aluminum bond pads coated with a thin layer of protective material.

18. The packaged semiconductor device according to claim 12, wherein the tape-leadframe leads have bumped contacts thereon.

19. The packaged semiconductor device according to claim 18, wherein the lead frame is a bumped copper tape plated with gold.

20. The packaged semiconductor device according to claim 18, wherein the lead frame is a bumped copper tape plated with palladium.

21. The packaged semiconductor device according to claim 18, wherein the leadframe is a bumped bare copper tape.

22. The packaged semiconductor device according to claim 12, wherein the tape leadframe includes dam bars between leads and includes multiple registration holes to align the device during the removal of dam bars and the removal of the frame.

23. The packaged semiconductor device according to claim 12, wherein the semiconductor chip and top-side encapsulant has less than a 40 mil thickness.

24. The packaged semiconductor device according to claim 18, wherein the leadframe is a flat bare copper tape.

* * * * *